United States Patent
Kobayashi et al.

(10) Patent No.: US 10,429,733 B2
(45) Date of Patent: Oct. 1, 2019

(54) LOW TEMPERATURE BAKING ADAPTED RESIST INK

(71) Applicant: DIC Graphics Corporation, Tokyo (JP)

(72) Inventors: Tomoe Kobayashi, Tokyo (JP); Toshio Watanabe, Tokyo (JP)

(73) Assignee: DIC GRAPHICS CORPORATION, Tokyo (JP)

( * ) Notice: Subject to any disclaimer, the term of this patent is extended or adjusted under 35 U.S.C. 154(b) by 0 days.

(21) Appl. No.: 15/771,663

(22) PCT Filed: Oct. 11, 2016

(86) PCT No.: PCT/JP2016/080079
§ 371 (c)(1),
(2) Date: Apr. 27, 2018

(87) PCT Pub. No.: WO2017/073309
PCT Pub. Date: May 4, 2017

(65) Prior Publication Data
US 2018/0307139 A1    Oct. 25, 2018

(30) Foreign Application Priority Data
Oct. 27, 2015   (JP) .................................. 2015-210769

(51) Int. Cl.
| | | |
|---|---|---|
| *C09D 11/03* | (2014.01) | |
| *C09D 11/037* | (2014.01) | |
| *C09D 11/104* | (2014.01) | |
| *C09D 11/14* | (2006.01) | |
| *H05K 3/06* | (2006.01) | |
| *G03F 7/038* | (2006.01) | |
| *G03F 7/039* | (2006.01) | |

(52) U.S. Cl.
CPC .............. *G03F 7/038* (2013.01); *C09D 11/03* (2013.01); *C09D 11/037* (2013.01); *C09D 11/104* (2013.01); *C09D 11/14* (2013.01); *G03F 7/039* (2013.01); *H05K 3/061* (2013.01)

(58) Field of Classification Search
None
See application file for complete search history.

(56) References Cited

U.S. PATENT DOCUMENTS

| | | | | |
|---|---|---|---|---|
| 2007/0141507 A1* | 6/2007 | Sakata | ............... | C08G 59/4207 430/270.1 |
| 2008/0245768 A1* | 10/2008 | Cottrell | .................. | C09D 11/34 216/42 |
| 2014/0045966 A1 | 2/2014 | Motofuji et al. | | |
| 2016/0237282 A1 | 8/2016 | Shimura et al. | | |
| 2018/0273757 A1* | 9/2018 | Shintou | .................. | B41M 5/385 |

FOREIGN PATENT DOCUMENTS

| | | |
|---|---|---|
| JP | 5-140208 A | 6/1993 |
| JP | 10-152542 A | 6/1998 |
| JP | 2002-129079 A | 5/2002 |
| JP | 2013-36024 A | 2/2013 |
| JP | 2015-65384 A | 4/2015 |
| JP | 2015-90903 A | 5/2015 |
| WO | WO 2017/056372 A1 * | 4/2017 |

OTHER PUBLICATIONS

English translation of JP 10/152542, Jun. 1998; 10 pages.*
International Search Report dated Jan. 10, 2017, issued in counterpart application No. PCT/JP2016/080079. (2 pages).

* cited by examiner

*Primary Examiner* — Helene Klemanski
(74) *Attorney, Agent, or Firm* — Westerman, Hattori, Daniels & Adrian, LLP

(57) ABSTRACT

The present invention has an object to provide a resist ink adaptable to low temperature baking that has both of an adhesiveness to the metal foil for constituting a circuit and an acidic etching resistance even at a low oven temperature. The present invention can overcome a negative effect of decreased baking temperature, that is, reduced adhesiveness of a printed coat to a substrate metal foil and reduced acidic etching resistance in the step of acidic etching. A resist ink is adaptable to low temperature baking containing a polyester resin, a titanium oxide, and an organic silicon compound as essential components.

5 Claims, No Drawings

LOW TEMPERATURE BAKING ADAPTED RESIST INK

FIELD OF INVENTION

The present invention relates to a resist ink used for producing a circuit board having a circuit pattern from a metal foil.

BACKGROUND OF INVENTION

"Radio frequency identifier (RFID) system", which allows for information exchanges to and from IC tags that store IC information by near field communication via wireless means, such as electromagnetic fields and radio waves, is mainly utilized for merchandise information control and theft prevention in the US, Europe, and other countries. Also in Japan, the need for RFID begins to increase. Resist inks are used in production of IC tags for use in RFID.

IC tags are typically produced as follows: a coil pattern for constituting a circuit pattern is printed on a metal foil with a resist ink using a masking method, the printed portion is optionally subjected to UV curing or heat curing, and then the metal foil is immersed in an acidic or alkaline etchant to remove portions that are unnecessary for the circuit pattern by etching, thereby producing the desired circuit pattern (for example, see PTL 1: JP-A-2015-65384).

A type of such a process where a printed coat for constituting a resist in etching is cured by heat typically requires baking at 170° C. to 200° C. with an oven. In such a case, a lower temperature in baking is desired from the viewpoints of energy saving and cost reduction. On the other hand, in the case of baking at a lower temperature, negative effects, such as reduced adhesiveness of the printed coat to a substrate metal foil or reduced acidic etching resistance in the step of acidic etching, are apt to be caused. There is a need for a resist ink adaptable to low temperature baking that maintains both the adhesiveness to a metal foil and the acidic etching resistance even under low temperature conditions at an oven temperature of 150° C.

CITATION LIST

Patent Literature

[PTL 1] JP-A-2015-65384

SUMMARY OF INVENTION

Technical Problem

The present invention has an object to provide a resist ink adaptable to low temperature baking that has both of an adhesiveness to a metal foil for constituting a circuit and an acidic etching resistance even at a low oven temperature.

Solution to Problem

As a result of intensive studies for achieving the above object, the present inventors have found that incorporation of a polyester resin, a titanium oxide, and an organic silicon compound as essential components into a resist ink adaptable to low temperature baking is effective to achieve the object.

Specifically, the present invention relates to a resist ink adaptable to low temperature baking, including a polyester resin, a titanium oxide, and an organic silicon compound as essential components.

The present invention also relates to the resist ink adaptable to low temperature baking, in which the titanium oxide is contained in an amount of 5 to 30% by weight based on the total amount of the resist ink.

The present invention also relates to the resist ink adaptable to low temperature baking, in which the polyester resin has a number average molecular weight of 2,000 to 80,000, and contains a polyester resin (A) having a glass transition temperature (Tg) of 50 to 85° C. in an amount of 70% by weight or more based on the total amount of the resin.

The present invention further relates to the resist ink adaptable to low temperature baking in which the organic silicon compound is one or more selected from the group consisting of 3-mercaptopropyltrimethoxysilane, methyltrimethoxysilane, methyltriethoxysilane, decyltrimethoxysilane, 3-aminopropyltrimethoxysilane, 3-glycidoxypropyltrimethoxysilane, 3-isocyanatopropyltriethoxysilane, phenyltriethoxysilane, p-styryltrimethoxysilane, and 3-chloropropyltrimethoxysilane.

In addition, the present invention relates to the resist ink adaptable to low temperature baking which contains a nitrocellulose.

Advantageous Effect of Invention

The present invention provides a resist ink adaptable to low temperature baking that has both of an adhesiveness to a metal foil for constituting a circuit and an acidic etching resistance even at a low oven temperature.

DESCRIPTION OF EMBODIMENTS

The present invention will be described in detail. It should be noted that the term "ink" used in the following description always refers to a "resist ink", and the term "parts" always refers to "parts by weight".

The present invention is an invention directed to a resist ink adaptable to low temperature baking, including a polyester resin, a titanium oxide, and an organic silicon compound.

Specifically, the resist ink of the present invention is prepared by dissolving a binder resin containing the polyester resin in various organic solvents, such as ethyl acetate, methyl ethyl ketone, and toluene. The titanium oxide is kneaded with the binder resin and the various organic solvents to produce an ink. Coloring pigments and various additives are added to the ink, and the mixture is further stirred to give a fully dispersed resist ink.

In the resist ink adaptable to low temperature baking of the present invention, a wide variety of known polyester resins can be used. The polyester resin is simply a polyester resin that is obtained by an esterification reaction of a polybasic acid component and a polyhydric alcohol component. As a polybasic acid component, for example, one or more of dibasic acids, such as phthalic anhydride, isophthalic anhydride, terephthalic acid, succinic acid, fumaric acid, adipic acid, azelaic acid, sebacic acid, and dimer acid, and lower alkyl esters thereof may be mainly used, and as needed, a monobasic acid, such as benzoic acid, crotonic acid, or p-t-butyl benzoate, a tri- or higher-basic acid, such as trimellitic anhydride, methylcyclohexene tricarboxylic acid, or pyromellitic anhydride, or the like may be used in combination.

As the polyhydric alcohol component, for example, a dihydric alcohol, such as ethylene glycol, diethylene glycol, propylene glycol, 1,4-butanediol, neopentyl glycol, 3-methylpentanediol, 1,4-hexanediol, 1,6-hexanediol, or cyclohexanedimethanol may be mainly used, and as needed, a tri- or higher-hydric alcohol, such as glycerol, trimethylolethane, trimethylolpropane, or pentaerythritol, may be used in combination. These polyhydric alcohols may be used alone or in mixture of two or more thereof.

The polyester resin preferably has a number average molecular weight of 2,000 to 80,000, and contains a polyester resin (A) having a glass transition temperature (Tg) of 50 to 85° C. in an amount of 70% by weight or more based on the total amount of the polyester resin. The number average molecular weight of the polyester resin is more preferably in the range of 3,000 to 40,000. In the case where the number average molecular weight of the polyester resin is less than 2,000, there is a tendency to decrease the adhesiveness of the resulting ink composition to a metal foil and the etching resistance of a resist coat to be formed therefrom. In the case where the number average molecular weight exceeds 80,000, there is a tendency to increase viscosity of the resulting ink compositions, thereby reducing coating ability so that gloss of the printed coat is reduced. The glass transition temperature (Tg) is further preferably 60 to 80° C., and most preferably 65 to 70° C. from the viewpoint of giving both the adhesiveness to a metal foil for constituting a circuit and the etching resistance of a resist coat to be formed therefrom.

Examples of commercial products include VYLON 300, 500, 560, 600, 630, 650, and 670, VYLON GK130, 140, 150, 190, 330, 590, 680, 780, 810, 890, 200, 226, 240, 245, 270, 280, 290, 296, 660, and 885, VYLON GK250, 360, 640, and 880, manufactured by Toyobo, Co. Ltd.; ELITEL UE-3220, 3500, 3210, 3215, 3216, 3620, 3240, 3250, and 3300, ELITEL UE-3200, 9200, 3201, 3203, 3350, 3370, 3380, 3600, 3980, 3660, 3690, 9600, and 9800, manufactured by UNITIKA, LTD.; and ARON MELT PES-310, 318, 334, 316, and 360 manufactured by Toagosei, Co., Ltd. These products are amorphous polyester resins. Since crystalline polyesters having a glass transition temperature (Tg) in the range of 50 to 85° C. has a high cohesive force due to the structure, it is difficult to obtain a crystalline polyester soluble in ordinary organic solvents. Accordingly, amorphous polyester resins are more suitable than crystalline polyester resins in terms of having both the adhesiveness of a cured resist coat to a metal foil and the acidic etching resistance when used for a resist ink.

In the resist ink adaptable to low temperature baking of the present invention, a titanium oxide is essentially used as a pigment. A surface-treated titanium oxide, which has a relatively high dispersibility, is particularly preferred. In particular, a titanium oxide surface-treated with an inorganic substance is preferred, and a titanium oxide surface-treated with a silica and an alumina is preferred.

As a titanium oxide in the titanium oxide surface-treated with a silica and an alumina, a known rutile-type or anatase-type titanium dioxide may be used, with the rutile-type being preferred.

The mean particle size of the titanium oxide is preferably 100 to 500 nm, and more preferably 150 to 400 nm. With the mean particle size of 100 nm or less, although the dispersion stability is easily achieved, the whiteness is reduced, making it difficult to control color for a color IC chip. On the other hand, when the mean particle size is 500 nm or more, there is a tendency to reduce smoothness and apparent gloss of an ink coating. The particle size is further preferably 200 to 300 nm from a practical viewpoint.

A mean particle size of titanium oxides as a raw material is determined by averaging sizes of 20 particles measured by electron micrography.

In the titanium oxide surface-treated with a silica and an alumina, the silica is generally used for the purpose of regulating the state of the acid or base on the surface of the titanium oxide or the purpose of imparting durability to the resulting ink or paint coats, and the alumina is generally used for the purpose of improving the wetness of the titanium oxide when dispersed. Examples of methods for the surface treatment of the titanium oxide include an aqueous treatment and a vapor phase treatment. Regarding the ratio of respective amounts of the titanium oxide treated with silica and alumina, the proportion of the amount of the titanium oxide treated with alumina is preferably 35% by mass or more and 80% by mass or less from the viewpoint of dispersion stability. In addition, the amount of the inorganic substance relative to the titanium oxide is not limited necessarily, and is generally 30 parts or less per 100 parts of the titanium oxide.

The content of the titanium oxide for use in the resist ink adaptable to low temperature baking of the present invention is preferably 5% by weight or more based on the total amount of the resist ink from the viewpoint of maintaining a sufficient etching resistance of a resist coat to be formed therefrom, and 30% by weight or less from the viewpoint of an appropriate ink viscosity and a work efficiency in ink production and printing. The content is more preferably in the range of 10 to 25% by weight.

Commercially available products, which are sold, for example, from ISHIHARA SANGYO KAISHA, LTD., Tayca Corporation, or other titanium oxide manufacturers, may be used as the titanium oxide surface-treated with a silica and an alumina. The available products include, for example, a titanium oxide with the amount treated with silica being larger than the amount treated with alumina, and a titanium oxide with the amount treated with alumina being larger than the amount treated with silica, and the titanium oxide in which the proportion of the amount treated with alumina is in the above range is available.

The resist ink adaptable to low temperature baking of the present invention essentially contains an organic silicon compound. The organic silicon compound in the present invention is a compound that is generally known as a silane coupling agent and represented by the chemical formula YSiX. In the formula, X represents an alkoxy group, which is a hydrolyzable moiety. Y is a moiety having one functional group selected from an alkyl group, an alkene group, an allene group, an aryl group, an amino group, an isocyanate group, an epoxy group, a chloro group, a mercapto group, and the like.

A functional group having a high polarity is more suitable for Y from the viewpoint of the adhesiveness to the substrate. Thus, Y more preferably has one functional group selected from an aryl group, an amino group, an isocyanate group, an epoxy group, and a mercapto group.

The organic silicon compound has a positive effect on the coating strength of the resist ink adaptable to low temperature baking of the present invention. The content is more preferably 0.05% by weight or more from the viewpoint of increased adhesiveness to a metal foil for constituting a circuit, and is preferably 2% by weight or less from the viewpoint of the stability of the ink composition.

Examples of the organic silicon compounds include 3-mercaptopropyltrimethoxysilane, methyltrimethoxysilane, methyltriethoxysilane, decyltrimethoxysilane, 3-aminopropyltrimethoxysilane, 3-glycidoxypropyltrimethoxysilane, 3-isocyanatopropyltriethoxysilane, phenyltriethoxysilane, p-styryltrimethoxysilane, and 3-chloropropyltrimethoxysilane. The compounds may be used alone or in combination of two or more thereof. Among them, 3-glycidoxypropyltrimethoxysilane and 3-aminopropyltrimethoxysilane are preferred from the viewpoint of the adhesiveness of a cured ink coat to an aluminum deposition film substrate and the etching resistance of a resist coat to be formed, and 3-glycidoxypropyltrimethoxysilane is more preferred.

The solvent usable for the resist ink adaptable to low temperature baking of the present invention is not limited specifically, and examples thereof include aromatic hydrocarbon-type solvents, such as toluene, xylene, Solvesso #100, and Solvesso #150; aliphatic hydrocarbon-type solvents, such as hexane, heptane, octane, and decane; and various ester-type organic solvents, such as methyl acetate, ethyl acetate, isopropyl acetate, butyl acetate, amyl acetate, ethyl formate, and butyl propionate. Examples of water-miscible organic solvents include: alcohol-type solvents, such as methanol, ethanol, propanol, and butanol; ketone-type solvents, such as acetone, methyl ethyl ketone, and cyclohexanone; and various glycol ether-type organic solvents, such as ethylene glycol (mono, di)methyl ether, ethylene glycol (mono, di)ethyl ether, ethylene glycol monopropyl ether, ethylene glycol monoisopropyl ether, monobutyl ether, diethylene glycol (mono, di)methyl ether, diethylene glycol (mono, di)ethyl ether, diethylene glycol monoisopropyl ether, diethylene glycol monobutyl ether, triethylene glycol (mono, di)methyl ether, propylene glycol (mono, di)methyl ether, propylene glycol monopropyl ether, propylene glycol monobutyl ether, and dipropylene glycol (mono, di)methyl ether. Among them, from the viewpoint of solubility into polyester resins, a mixture liquid of toluene/methyl ethyl ketone/ethyl acetate is more preferred.

When an appropriate amount of a nitrocellulose is also used in the resist ink adaptable to low temperature baking of the present invention, the adhesiveness to metal foil for constituting a circuit and the acidic etching resistance can be further maintained. The added amount of the nitrocellulose is preferably 3 to 20% by weight based on the total amount of the resist ink.

The resist ink adaptable to low temperature baking of the present invention can be colored, as required for color IC tags, using organic and inorganic pigments and dyes that are generally used for inks, paints, recording agents, and the like. Examples of organic pigments include azo-type, phthalocyanine-type, anthraquinone-type, perylene-type, perinone-type, quinacridone-type, thioindigo-type, dioxazine-type, isoindolinone-type, quinophthalone-type, azomethine-azo-type, diketopyrrolopyrrole-type, and isoindoline-type pigments. Copper phthalocyanine is preferably used for indigo blue inks, and in terms of cost and light fastness, C. I. Pigment No Yellow 83 is preferably used for transparent yellow inks. The colorant is preferably contained in an amount enough to ensure the concentration and coloring ability of the ink, that is, in a proportion of 1 to 50% by weight based on the total weight of the ink. The colorants may be used alone or in combination of two or more thereof.

In the present invention, as required, extender pigments, pigment dispersants, leveling agents, anti-foaming agents, waxes, plasticizers, infrared absorbers, UV absorbers, fragrances, flame retardants, and the like may further be incorporated.

A particle size distribution of a pigment in a pigment dispersion can be controlled by appropriately adjusting the size of grinding media in a disperser, the grinding media filling rate, the dispersion time, the discharge rate of the pigment dispersion, the viscosity of the pigment dispersion, and the like. As a disperser, a generally used disperser, for example, a roller mill, a ball mill, a pebble mill, an attritor, or a sand mill, may be used. Air bubbles, unexpected coarse particles, and the like, when contained in the ink, are preferably removed by filtration or the like, since they may cause reduced printing quality. Conventionally-known filters may be used for the filtration.

The metal foil, on which the resist ink adaptable to low temperature baking of the present invention is to be printed, may previously be bonded to a plastic film, such as a polyester resin film, or may be bonded to various resin films after the printing, corrosion, and circuit formation process. In either case, the adhesive surface to the resist ink is the metal foil surface. The thickness of the metal foil and the thickness of the plastic film to be bonded may range from several micrometers to several tens of micrometers according to the use purpose.

EXAMPLES

The present invention will be described more specifically by examples. Hereinunder, all "parts" and "%" are by weight.

In the present invention, measurement of number average molecular weights (in terms of polystyrene) Mn by gel permeation chromatography (GPC) was performed using HLC8220 System manufactured by Tosoh Corporation under the following conditions.
Separation column: four columns of TSKgel GMHHR-N manufactured by Tosoh Corporation, column temperature: 40° C., mobile phase: tetrahydrofuran manufactured by Wako Pure Chemical Industries, Ltd., flow rate: 1.0 ml/min., sample concentration: 1.0% by weight, sample injection: 100 microliters, detector: differential refractometer Glass transition temperatures (Tg) were measured under a differential atmosphere using a cooling device by performing a scan from −80 to 450° C. at a temperature rising rate of 10° C./minute.
[Production of Polyester Resin Solution]

Into a four-neck flask, 43 parts of a polyester resin VYLON 200 (Tg: 67° C., Mn: 17,000) manufactured by Toyobo, Co., Ltd., 50 parts of toluene, 30 parts of methyl ethyl ketone, and 20 parts of ethyl acetate were charged, and the resulting mixture was heated to 80° C. and then held at the temperature for 2 hours. After confirmation of complete dissolving of the resin, the mixture was cooled to room temperature to obtain a resin solution (A1) of VYLON 200 with a solid content of 35%.

Similarly, a resin solution (A2) of VYLON 240 (manufactured by Toyobo, Co., Ltd., Tg: 60° C., number average molecular weight Mn: 15,000) with a solid content of 35% was obtained using the same ratio of the resin and the solvents and the same procedure as above.

Then, resin solutions (A3) to (A8) with a solid content of 35% were obtained in the same manner except for using VYLON 296 (manufactured by Toyobo, Co., Ltd., Tg: 71° C., Mn: 14,000), VYLON 290 (manufactured by Toyobo, Co., Ltd., Tg: 72° C., Mn: 22,000), VYLON 660 (manufactured by Toyobo, Co., Ltd., Tg: 55° C., Mn: 8,000), VYLON 600 (manufactured by Toyobo, Co., Ltd., Tg: 47° C., Mn: 16,000), VYLON 500 (manufactured by Toyobo, Co., Ltd., Tg: 4° C., Mn: 23,000), and VYLON GX880 (manufactured by Toyobo, Co., Ltd., Tg: 84° C., Mn: 18,000), respectively.
[Production of Nitrocellulose Varnish Liquid]

To 37.5 parts of an industrial nitrocellulose DHX3-5 (nitrocellulose, non-volatile content: 70%, manufactured by Nobel NC, Ltd.), 62.5 parts of a mixture liquid of toluene/methyl ethyl ketone/ethyl acetate (in a ratio of 50/30/20 by weight) was added and sufficiently mixed to produce a nitrocellulose varnish liquid (S).

Example 1

0.5 Parts of Symuler Fast Red 4613 yellow pigment (manufactured by DIC Corporation) and 0.2 parts of Fastogen Super Violet RN violet pigment (manufactured by DIC Corporation) for a color IC chip for reproducing a pink color were added to a mixture of 35 parts of the obtained polyester resin solution (A1), 13 parts of Titanium White R-830 (rutile-type sulfuric acid-method titanium oxide, mean particle size: 250 nm, oil absorption: 21, manufactured by ISHIHARA SANGYO KAISHA, LTD.), 1 part of a silane coupling agent Z6040 (3-glycidoxypropyltrimethoxysilane, manufactured by Dow Corning Toray Co., Ltd.), 25.1 parts of toluene, 15.1 parts of methyl ethyl ketone, and 10.1 parts of ethyl acetate, and the resultant mixture was kneaded to produce a pink resist ink.

The ratio of toluene/methyl ethyl ketone/ethyl acetate was 50/30/20 by weight, with the weight of the whole resist ink being 100 parts.

To the obtained resist ink, a mixture liquid of toluene/methyl ethyl ketone/ethyl acetate having a ratio of 50/30/20 by weight was added to adjust the viscosity to 18 seconds (25° C.) as determined by Zahn cup #3 (manufactured by Rigo, Co. Ltd.). Using a gravure proof press provided with a helio-type direct engraving gravure intaglio plate (225 lines/inch), whole solid printing was performed on a metal foil (size: 20 cm length×10 cm width) twice so as to give an amount of coating of 2.7 g/m².

Examples 1 to 17 and Comparative Examples 1 and 2

According to the composition shown in Table 1, a resist ink was produced for each of Examples 2 to 17 and Comparative Examples 1 and 2 in the same manner as in Example 1, the viscosity was adjusted, and then the solid printing was performed on a metal foil in the same manner.

In Example 6, 7.5 parts of the nitrocellulose varnish liquid (S) was added to the same mixture as in Example 1. In Example 17, 1 part of KBE903 (3-aminopropyltrimethoxysilane, manufactured by Dow Corning Toray Co., Ltd.) was added as a silane coupling agent in place of 1 part of Z6040 (3-glycidoxypropyltrimethoxysilane).

1) Adhesiveness

The metal foil with the solid-printed resist ink was heated in an oven (Environmental test chamber HISPEC HT 310 manufactured by Kusumoto Chemicals, Ltd.) at 150° C. for 6 minutes, and then allowed to stand at a normal temperature (25° C.) for 2 hours. A piece of cellophane tape (manufactured by Nichiban Co., Ltd.) was stuck to the printed surface and then rapidly peeled off. At this time, the appearance of the resist printed coat was visually evaluated. The evaluation was made by the following 5-point rating scale.

5: The resist coat was never peeled off.
4: 70% or more to 90% of the resist coat remained on the metal foil.
3: 50% or more and less than 70% of the resist coat remained on the metal foil.
2: 30% or more and less than 50% of the resist coat remained on the metal foil.
1: 30% or less of the resist coat remained on the metal foil.

2) Acid Etching Resistance

A 20% hydrochloric acid solution was stored on an acid resistant tray at a liquid temperature of 45° C. The metal foil with the solid-printed resist ink was immersed therein for 120 seconds, then picked up and washed with water. The appearance of the resist printed coat was then visually evaluated according to the following 5-point rating scale.

5: The resist coat was never peeled off.
4: 70% or more to 90% of the resist coat remained on the metal foil.
3: 50% or more and less than 70% of the resist coat remained on the metal foil.
2: 30% or more and less than 50% of the resist coat remained on the metal foil.
1: 30% or less of the resist coat remained on the metal foil.

The evaluation results are shown in Tables 1 to 3 below.

TABLE 1

| | | Example | | | | | | |
|---|---|---|---|---|---|---|---|---|
| | | 1 | 2 | 3 | 4 | 5 | 6 | 7 |
| Titanium oxide | Titanium White R-830 | 13.0 | 5.0 | 30.0 | 2.5 | 40.0 | 13.0 | 13.0 |
| Coloring pigment | Symuler Fast Red 4613 (yellow) pigment | 0.5 | 0.5 | 0.5 | 0.5 | 0.5 | 0.5 | 0.5 |
| | Fastogen Super Violet (violet) pigment | 0.2 | 0.2 | 0.2 | 0.2 | 0.2 | 0.2 | 0.2 |
| Polyester resin solution (solid content 35%) | (A1) VYLON 200 (Tg = 67° C., Mn = 17,000) | 35.0 | 35.0 | 35.0 | 35.0 | 35.0 | 35.0 | |
| | (A2) VYLON 240 (Tg = 60° C., Mn = 15,000) | | | | | | | 35.0 |
| | (A3) VYLON 296 (Tg = 71° C., Mn = 14,000) | | | | | | | |
| | (A4) VYLON 290 (Tg = 72° C., Mn = 22,000) | | | | | | | |
| | (A5) VYLON 660 (Tg = 55° C., Mn = 8,000) | | | | | | | |
| | (A6) VYLON 600 (Tg = 47° C., Mn = 16,000) | | | | | | | |

TABLE 1-continued

|  |  | Example | | | | | | |
|---|---|---|---|---|---|---|---|---|
|  |  | 1 | 2 | 3 | 4 | 5 | 6 | 7 |
|  | (A7) VYLON 500 (Tg = 4° C., Mn = 23,000) |  |  |  |  |  |  |  |
|  | (A8) VYLON GK880 (Tg = 84° C., Mn = 18,000) |  |  |  |  |  |  |  |
| Nitrocellulose varnish | (S)Nitrocellulose vanish liquid |  |  |  |  |  | 7.5 |  |
| Silane coupling agent | Z6040 (3-glycidoxypropyl trimethoxysilane) | 1.0 | 1.0 | 1.0 | 1.0 | 1.0 | 1.0 | 1.0 |
|  | KBE903 (3-aminopropyl triethoxysilane) |  |  |  |  |  |  |  |
| Solvent | Toluene | 25.1 | 29.1 | 16.6 | 30.4 | 11.6 | 21.4 | 25.1 |
|  | Methyl ethyl ketone | 15.1 | 17.5 | 10.0 | 18.3 | 7.0 | 12.8 | 15.1 |
|  | Ethyl acetate | 10.1 | 11.7 | 6.7 | 12.1 | 4.7 | 8.6 | 10.1 |
|  | Total amount | 100.0 | 100.0 | 100.0 | 100.0 | 100.0 | 100.0 | 100.0 |
| Evaluation results | Adhesiveness (after heating at 150° C.) | 5 | 5 | 5 | 5 | 4 | 5 | 5 |
|  | Etching resistance | 5 | 5 | 5 | 4 | 5 | 5 | 4 |

TABLE 2

|  |  | Example | | | | | |
|---|---|---|---|---|---|---|---|
|  |  | 8 | 9 | 10 | 11 | 12 | 13 |
| Titanium oxide | Titanium White R-830 | 13.0 | 13.0 | 13.0 | 13.0 | 13.0 | 13.0 |
| Coloring pigment | Symuler Fast Red 4613 (yellow) pigment | 0.5 | 0.5 | 0.5 | 0.5 | 0.5 | 0.5 |
|  | Fastogen Super Violet (violet) pigment | 0.2 | 0.2 | 0.2 | 0.2 | 0.2 | 0.2 |
| Polyester resin solution (solid content 35%) | (A1) VYLON 200 (Tg = 67° C., Mn = 17,000) |  |  |  | 25.0 | 25.0 | 25.0 |
|  | (A2) VYLON 240 (Tg = 60° C., Mn = 15,000) |  |  |  |  |  |  |
|  | (A3) VYLON 296 (Tg = 71° C., Mn = 14,000) | 35.0 |  |  |  |  |  |
|  | (A4) VYLON 290 (Tg = 72° C., Mn = 22,000) |  | 35.0 |  |  |  |  |
|  | (A5) VYLON 660 (Tg = 55° C., Mn = 8,000) |  |  | 35.0 |  |  |  |
|  | (A6) VYLON 600 (Tg = 47° C., Mn = 16,000) |  |  |  | 12.0 |  |  |
|  | (A7) VYLON 500 (Tg = 4° C., Mn = 23,000) |  |  |  |  | 12.0 |  |
|  | (A8) VYLON GK880 (Tg = 84° C., Mn = 18,000) |  |  |  |  |  | 12.0 |
| Nitrocellulose varnish | (S)Nitrocellulose vanish liquid |  |  |  |  |  |  |
| Silane coupling agent | Z6040 (3-glycidoxypropyl trimethoxysilane) | 1.0 | 1.0 | 1.0 | 1.0 | 1.0 | 1.0 |
|  | KBE903 (3-aminopropyl triethoxysilane) |  |  |  |  |  |  |
| Solvent | Toluene | 25.1 | 25.1 | 25.1 | 25.1 | 25.1 | 25.1 |
|  | Methyl ethyl ketone | 15.1 | 15.1 | 15.1 | 15.1 | 15.1 | 15.1 |
|  | Ethyl acetate | 10.1 | 10.1 | 10.1 | 10.1 | 10.1 | 10.1 |
|  | Total amount | 100.0 | 100.0 | 100.0 | 102.0 | 102.0 | 102.0 |
| Evaluation results | Adhesiveness (after heating at 150° C.) | 5 | 5 | 4 | 4 | 4 | 4 |
|  | Etching resistance | 4 | 4 | 4 | 4 | 4 | 4 |

TABLE 3

|  |  | Example | | | | Comparative Example | |
| --- | --- | --- | --- | --- | --- | --- | --- |
|  |  | 14 | 15 | 16 | 17 | 1 | 2 |
| Titanium oxide | Titanium White R-830 | 13.0 | 13.0 | 13.0 | 13.0 | 13.0 | 0.0 |
| Coloring pigment | Symuler Fast Red 4613 (yellow) pigment | 0.5 | 0.5 | 0.5 | 0.5 | 0.5 | 0.5 |
|  | Fastogen Super Violet (violet) pigment | 0.2 | 0.2 | 0.2 | 0.2 | 0.2 | 0.2 |
| Polyester resin solution (solid content 35%) | (A1) VYLON 200 (Tg = 67° C., Mn = 17,000) |  |  |  | 23.0 | 35.0 | 35.0 |
|  | (A2) VYLON 240 (Tg = 60° C., Mn = 15,000) |  |  |  |  |  |  |
|  | (A3) VYLON 296 (Tg = 71° C., Mn = 14,000) |  |  |  |  |  |  |
|  | (A4) VYLON 290 (Tg = 72° C., Mn = 22,000) |  |  |  |  |  |  |
|  | (A5) VYLON 660 (Tg = 55° C., Mn = 8,000) |  |  |  |  |  |  |
|  | (A6) VYLON 600 (Tg = 47° C., Mn = 16,000) | 12.0 |  |  |  |  |  |
|  | (A7) VYLON 500 (Tg = 4° C., Mn = 23,000) |  | 12.0 |  |  |  |  |
|  | (A8) VYLON GK880 (Tg = 84° C., Mn = 18,000) |  |  | 12.0 |  |  |  |
| Nitrocellulose varnish | (S) Nitrocellulose vanish liquid |  |  |  |  |  |  |
| Silane coupling agent | Z6040 (3-glycidoxypropyl trimethoxysilane) | 1.0 | 1.0 | 1.0 |  | 1.0 |  |
|  | KBE903 (3-aminopropyl triethoxysilane) |  |  |  | 1.0 |  |  |
| Solvent | Toluene | 25.1 | 25.1 | 25.1 | 25.1 | 25.7 | 31.6 |
|  | Methyl ethyl ketone | 15.1 | 15.1 | 15.1 | 15.1 | 15.3 | 19.0 |
|  | Ethyl acetate | 10.1 | 10.1 | 10.1 | 10.1 | 10.3 | 12.7 |
|  | Total amount | 100.0 | 100.0 | 100.0 | 100.0 | 100.0 | 100.0 |
| Evaluation results | Adhesiveness (after heating at 150° C.) | 4 | 4 | 4 | 5 | 2 | 2 |
|  | Etching resistance | 3 | 3 | 3 | 4 | 2 | 1 |

The resist ink shown by the Examples has both the adhesiveness to a metal foil for constituting a circuit and the acidic etching resistance even at a low oven temperature of 150° C.

INDUSTRIAL APPLICABILITY

The resist ink adaptable to low temperature baking of the present invention exhibits both of an adhesiveness to a metal foil for constituting a circuit and an acidic etching resistance even at a low oven temperature, and thus can be widely developed as resist inks for IC tags with energy saving and cost reduction taken into account.

The invention claimed is:

1. A resist ink adaptable to low temperature baking, comprising a polyester resin, a titanium oxide, and an organic silicon compound,
    wherein the titanium oxide is contained in an amount of 2.5 to 30% by weight based on the total amount of the resist ink.

2. The resist ink adaptable to low temperature baking according to claim 1, wherein the titanium oxide is contained in an amount of 5 to 30% by weight based on the total amount of the resist ink.

3. The resist ink adaptable to low temperature baking according to claim 1, wherein the polyester resin has a number average molecular weight of 2,000 to 80,000, and contains a polyester resin (A) having a glass transition temperature (Tg) of 50 to 85° C. in an amount of 70% by weight or more based on the total amount of the polyester resin.

4. The resist ink adaptable to low temperature baking according to claim 1, wherein the organic silicon compound is one or more selected from the group consisting of 3-mercaptopropyltrimethoxysilane, methyltrimethoxysilane, methyltriethoxysilane, decyltrimethoxysilane, 3-aminopropyltrimethoxysilane, 3-glycidoxypropyltrimethoxysilane, 3-isocyanatopropyltriethoxysilane, phenyltriethoxysilane, p-styryltrimethoxysilane, and 3-chloropropyltrimethoxysilane.

5. The resist ink adaptable to low temperature baking according to claim 1, further comprising a nitrocellulose.

* * * * *